SHEARING TOOL

Filed April 14, 1959

3 Sheets-Sheet 1

INVENTOR

ARTHUR LIEBSCHER

BY Hurvitz & Rose

ATTORNEYS

Nov. 6, 1962 A. LIEBSCHER 3,062,245

SHEARING TOOL

Filed April 14, 1959 3 Sheets-Sheet 2

INVENTOR

ARTHUR LIEBSCHER

BY Hurvitz & Rose

ATTORNEYS

Nov. 6, 1962 A. LIEBSCHER 3,062,245

SHEARING TOOL

Filed April 14, 1959 3 Sheets-Sheet 3

INVENTOR
ARTHUR LIEBSCHER

BY Hurwitz & Rose
ATTORNEYS

United States Patent Office 3,062,245

Patented Nov. 6, 1962

3,062,245

SHEARING TOOL

Arthur Liebscher, Jenkintown, Pa., assignor to Electronics, Inc. of Pa., Willow Grove, Pa., a corporation of Pennsylvania Filed Apr. 14, 1959, Ser. No. 806,237
8 Claims. (Cl. 140—1)

The present invention relates generally to shearing tools for leads of electrical components inserted in apertures of printed wiring boards, and more particularly to shearing tools for simultaneously shearing the leads of all the components of a printed wire assembly after their insertion in the assembly.

The common practice of assembling components on printed wiring boards, either manually or by machine, involves the insertion of component leads through appropriate holes in the board to establish contact with printed-wiring on the opposite surface of the board. Generally, the leads also serve as a means of mounting and holding the components snugly against the board.

In some commercial assemblies, the component leads are purposely bent against the board where they emerge from mounting holes; in other such assemblies the leads remain straight and are trimmed a short distance beyond the point of protrusion. In either case, the leads may be pre-cut to length, but, at a disadvantage to facility of manual insertion of the leads since the flexibility of long leads facilitates quick alignment with the mounting holes. Post-insertion cutting of all of the component leads, either for bent or for straight connections, can be achieved with the shearing tool of the present invention. With a single stroke, the tool simultaneously shears all of the leads of a printed-wiring assembly to a uniform length. The tool also serves as an assembly fixture for the mounting of components prior to shearing of their leads.

Briefly describing a shearing tool according to the present invention, it comprises two, thin, hardened steel plates, each having an identical set of holes patterned to match those in a printed-wiring board; a supporting frame for horizontally mounting the two shear plates and a mechanism for sliding the lower plate beneath the stationary upper plate.

A cushion-spring and return-stop serve to relocate and re-align top and bottom-plate holes after each shearing stroke.

A manually operated cam and lever is used to actuate the sliding plate, although power operated devices can be substituted as actuating means.

Describing briefly the mode of utilization of the invention, a printed-wiring board is laid on the top shearing plate surface with the wiring side down, and the holes of the board are aligned with those in the shear plate by means of one or more locating pins. Components are mounted by inserting their leads into the proper mounting holes in the wiring board, thus permitting the leads to extend through the respective holes in both shear plates.

When all the components are in place, the movable shear plate is actuated. By sliding the movable plate a distance equal to the diameter of the largest shearing hole, all leads are severed at the adjoining surfaces of the shear plates. The cut-off portions of the leads drop into an accumulation tray.

It is accordingly a broad object of the invention to provide a novel shearing tool.

It is another object of the invention to provide a novel shearing tool for simultaneously shearing the leads of a plurality of electrical components to uniform extents of protrusion from a printed circuit wiring board.

The above and still further objects, features and advantages of the present invention will become apparent upon consideration of the following detailed description of one specific embodiment thereof, especially when taken in conjunction with the accompanying drawings, wherein.

Figures 1, 2:
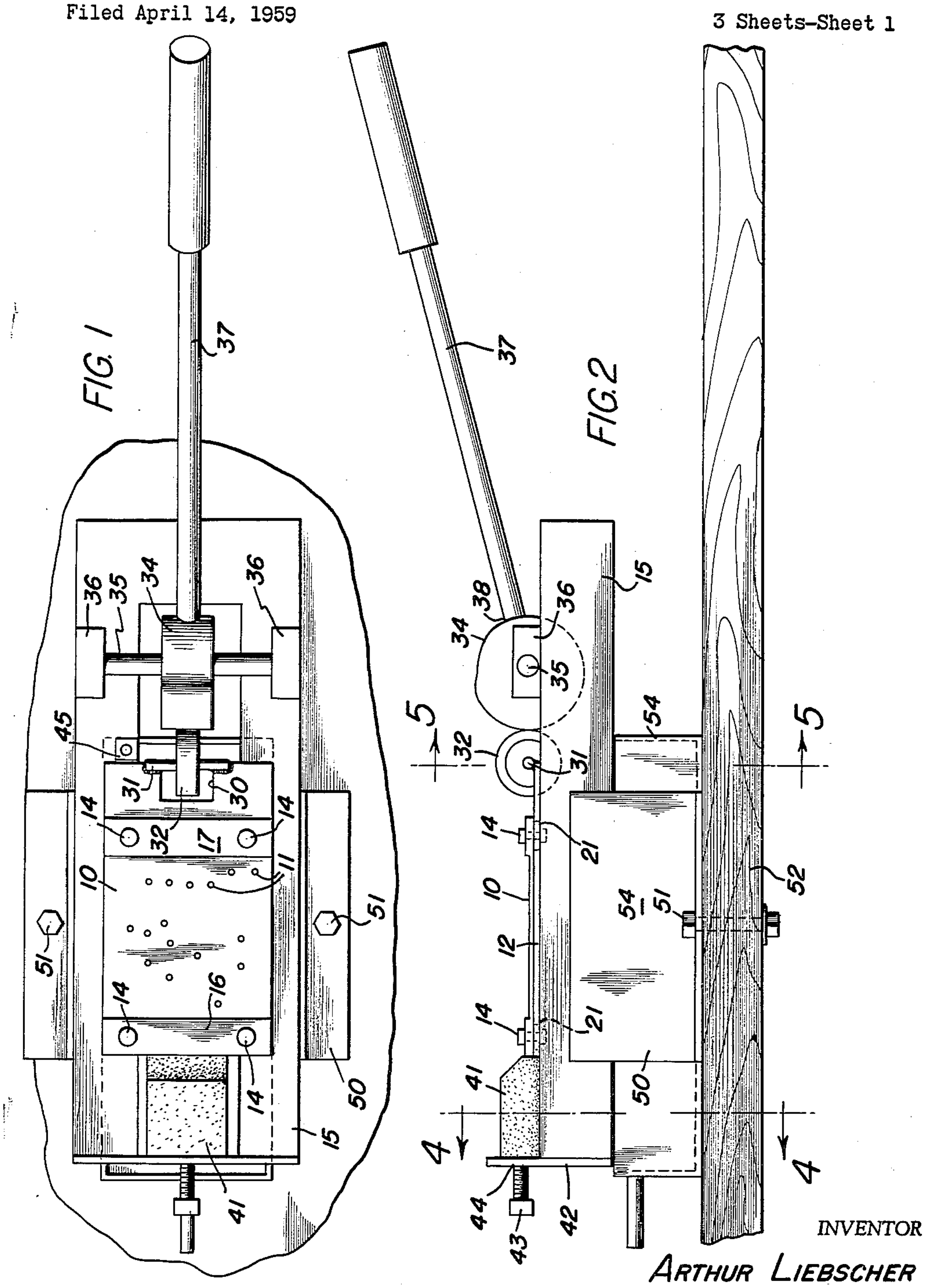
FIGURE 1 is a view in plan of a machine according to the invention.
FIGURE 2 is a view in side elevation of the machine of FIGURE 1.

Referring now more particularly to the accompanying drawings, the reference numeral 10 denotes a top shearing plate, having a typical set of apertures 11. An under shearing plate is denominated 12, and includes apertures 13 mating with apertures 11. The upper plate 10 is stationary, while the under plate 12 is moved in shearing relation to the upper plate 10. The upper plate 10 is bolted, as by bolts 14, to the bed or frame 15, of the machine.

Figure 3:
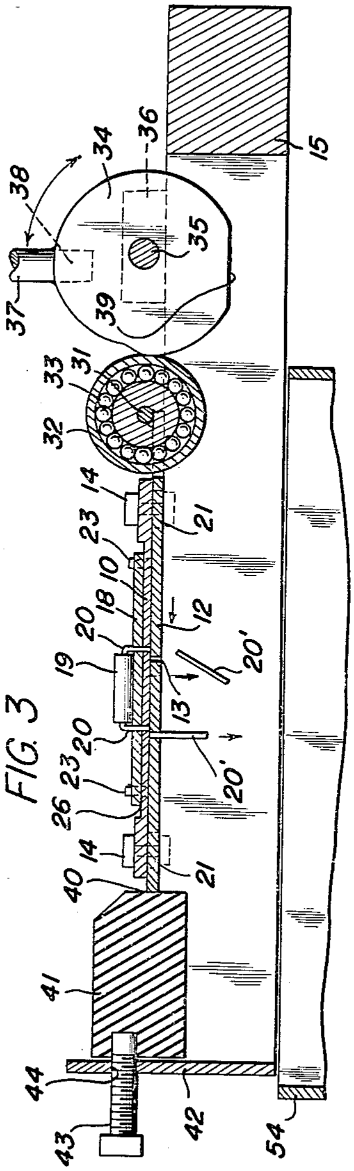
FIGURE 3 is a view in side section, through a portion of the machine of FIGURES 1 and 2.
Figures 5, 6:
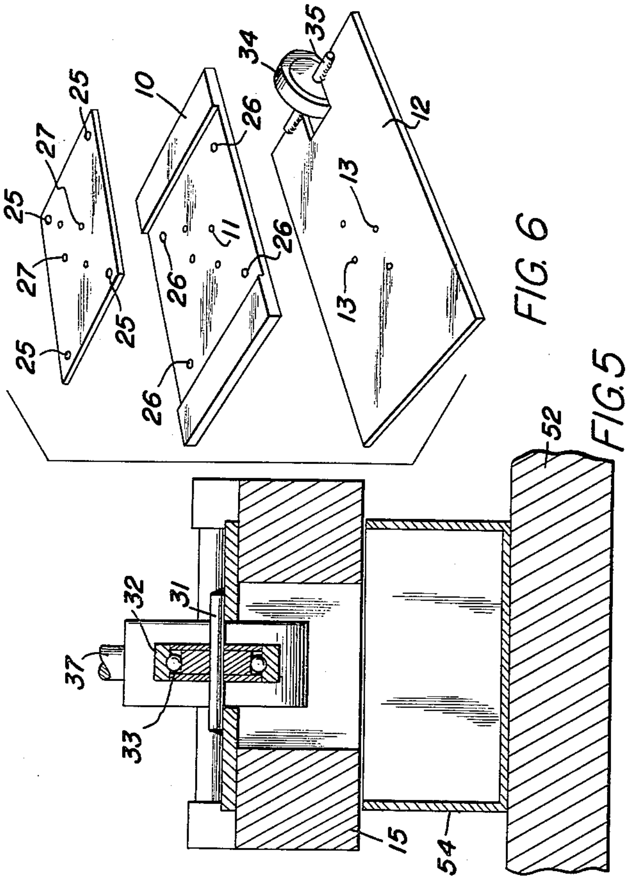
FIGURE 5 is a view in section taken on the line 5—5 of FIGURE 2.
FIGURE 6 shows certain details in superposed perspective.
Figure 4:
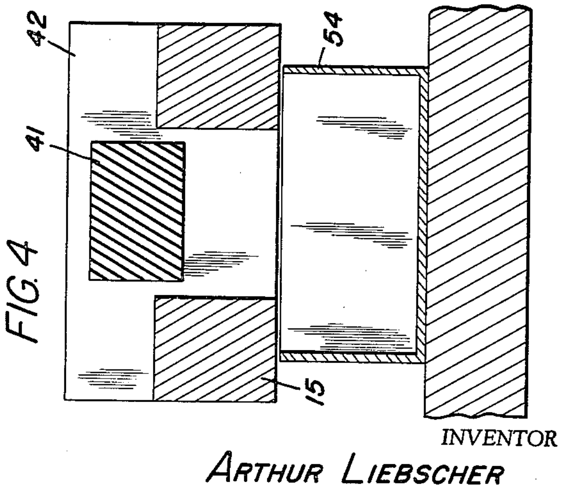
FIGURE 4 is a view in section taken on the line 4—4 of FIGURE 2.
Figure 7:
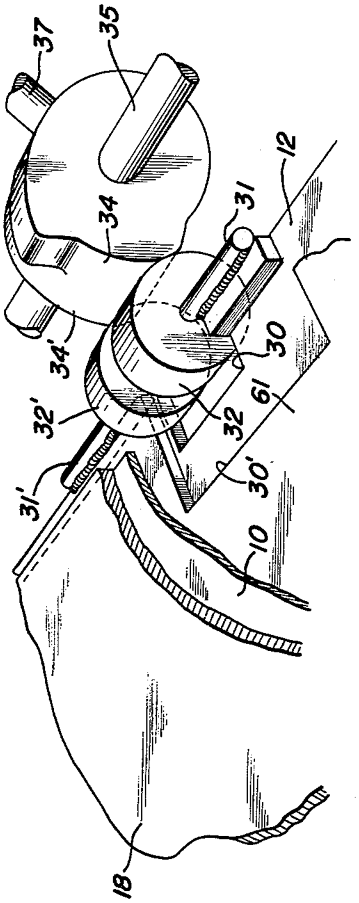
FIGURE 7 is a view in perspective of a modification of the system of FIGURES 1–6, inclusive, arranged for crimping leads as well as for shearing same.
Figure 9:
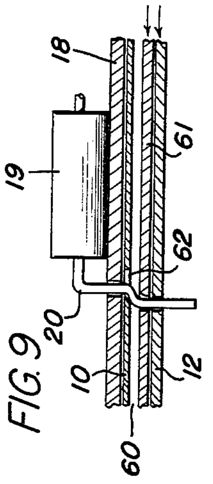
FIGURES 8 to 11 are views of crimping and shearing plates of the system of FIGURE 7, in various relative positions.
Figure 11:
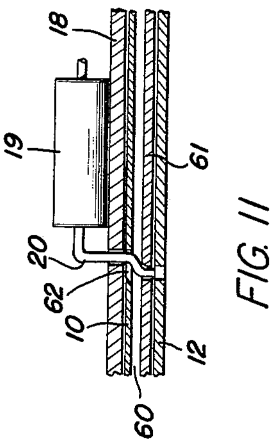
Figure 8:
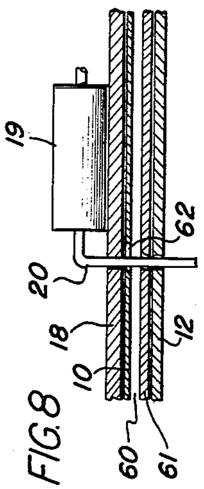
Figure 10:
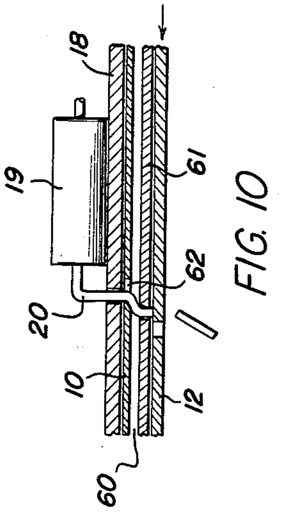

The upper plate 10 includes a rectangular depressed area lying between thickened end elements 16, 17, the depressed area providing a receptacle for a printed circuit board 18 (FIG. 3). On the circuit board 18 is shown for example only and to simplify the drawings, a single component 19, having leads 20 bent at right angles to the longitudinal axis of the component and extending through pairs of mating apertures 11, 13. Clearly, any desired plurality of such components may be similarly mounted.

The under plate 12 is constrained to move linearly with respect to the upper plate 10, by virtue of guide slots 21 through which extend the bolts 14, and the slots 21 are sufficiently extended longitudinally to permit longitudinal movement of the under plate 12 with respect to the upper plate 10, of adequate extent to complete shearing action.

The circuit board 18 may be located with respect to the upper plate 10 by means of one or more locating pins 23, extending through suitable mating apertures 25, 26 in the circuit board 18 and the upper plate 10. When the circuit board 18 has been located by pins 23, apertures 27 in the circuit board 18 align with apertures 11 and 13 in the upper and under shearing plates 10 and 12, respectively. Components 19 may then be placed on the circuit board with leads 20 extending through the apertures and with the ends 20′ of the components extending below the upper shearing plate 10, and as illustrated, below the under plate 12.

Secured to the under plate 12, and extending across a slot 30 cut in one end thereof, is a stationary shaft 31. A cam follower 32, of circular cross section, is mounted for rotation on shaft 31, and preferably a ball race for ball bearings 33 is provided intermediate shaft 31 and cam follower 32.

A cam 34 is provided, which rotates on a shaft 35, extending between blocks 36. A rod 37 extends into a radial aperture 38 in cam 34 to permit manual actuation of the cam 34.

The cam 34 bears against the cam follower 32, and on rotation of the cam 34 forces the follower 32 and the under plate 12 to which it is secured, forwardly. Thereby, shearing action of the lower plate 12 with respect to the upper plate 10 occurs. A dwell or over-ride recess 39 is provided in the surface of cam 34 to prevent damage to the ball bearings 33.

The under plate 12 at its forward edge 40 bears against rubber pad 41, which acts as a return spring. The latter is secured to a standard 42 by means of an adjustment bolt 43, which threadedly engages a threaded aperture 44 in standard 42, and an end of which supports the pad 41. Thereby, the position of the pad 41 with relation to the forward edge 40 of under plate 12 may be adjusted. A rearward stop 45 is provided to limit the rearward motion of the under plate 12, which occurs in response to pressure excited by pad 41.

The entire machine is mounted on bed or frame 15. The frame 15 is mounted on a frame support 50, which is in turn bolted as by bolts 51 to a bench top 52, or other suitable structural member. Located under the shearing plates 10, 12 is a removable receptacle 54, into which fall the sheared leads 20′.

*Operation*

In operation a printed circuit board 18 is laid flat on the surface of upper plate 10. It is located by means of locating pins 23. Thereafter, the leads of suitable components are inserted downwardly into apertures 27 of the circuit board 18, apertures 11 of upper plate 10, and apertures 13 of under plate 12, these apertures mating when the wafer board 18 is located by pins 23.

When the component leads have all been inserted, the rod 37 is manually actuated, rotating cam 34 and forcing cam follower 32 forwardly. Since the latter is secured against translation with respect to under plate 12, the latter moves forwardly, against the back pressure of pad 41, and effects shearing action. Lead ends 20′ drop into receptacle 54. Rod 37 is then manually actuated in reverse direction, until dwell 39 is opposed to cam follower 32, the resilient pad 41 then causing the under plate 12 to return to its initial position, against stop 45.

The circuit board may be then removed, the leads of the components 19 being of uniform lengths in vertical extension, under the circuit board 18.

The shearing tool hereinabove described may be fitted with facilities to enable crimping of the component leads just prior to shearing, and in response to actuation of rod 37. Crimping is done after components are inserted into the printed-wire board and in order to mechanically secure them to the board before soldering.

The machine of FIGURES 1 to 6, if modified to perform crimping, according to FIGURES 7 to 11, may operate as for shearing.

First, to allow room for the bent leads a space 60 equal to lead diameter must be provided between a support plate, as 10, and a forming plate 61, beneath which slides the shear plate 12. The support plate 10 is formed with enlarged apertures 62, greater than the maximum dimension of the offset or crimp of the leads. This permits removal of the board 18 with the leads crimped. The forming plate 61 is actuated a small amount, and the shear plate 12 a greater amount, in response to actuation of rod 37, so that shearing takes place by virtue of movement of the shear plate 12 with respect to forming plate 61. A supplementary cam 34′ and supplementary cam follower 32′ may be provided to actuate the forming plate, which may be biased and returned to its original position by the resilient pad 41.

Obviously, while I have shown and described my invention as manually actuated, an electric motor may be employed in place of manual actuation, to actuate the cams 34, 34′, or the cam 34.

While I have described and illustrated one specific embodiment of my invention, it will be clear that variations of the details of construction which are specifically illustrated and described may be resorted to without departing from the true spirit and scope of the invention as defined in the appended claims.

What I claim is:

1. A lead shearing machine for the leads of components extending through a wiring board comprising an upper hard metallic plate, an under hard metallic plate, said upper plate and under plate subsisting in parallel planes and having mating apertures, said leads extending from said wiring board through said apertures, means for maintaining one of said plates immovable with respect to said wiring board, means for actuating the other of said plates in lead shearing relation to said one of said plates, said plates having apertures patterned to receive said leads and being positioned in contact throughout at adjacent surfaces, including a cam follower secured to said other of said plates, a rotary cam arranged to actuate said cam follower in translation on rotation of said rotary cam, and manually operative means for rotating said rotary cam, a resilient cushion located in the path of said other of said plates and operative in response to actuation of said other of said plates in lead shearing relation to said one of said plates into condition to return said other of said plates to unactuated position.

2. The combination according to claim 1 wherein said under plate is the other of said plates.

3. The combination according to claim 1 wherein said resilient cushion is a resilient pad positioned in the path of movement of said other of said plates.

4. The combination according to claim 3 wherein said cam follower is a rotary disc rotatable on a shaft secured to said other of said plates.

5. A leads crimping and shearing machine for leads of components extending from a mounting board, comprising an upper hard metallic plate, an under hard metallic shearing plate, an under crimping plate, said plates occupying parallel planes, said crimping plate being spaced from said upper plate, said shearing plate being in contacting relation to said crimping plate, said crimping plate lying intermediate said upper plate and said shearing plate, all said plates having mating apertures through which said leads extend, means for actuating said shearing plate and said crimping plate relative to said upper plate and in a direction parallel to the planes of said crimping plate and shearing plate, respectively, the movement of said crimping plate being adequate only to crimp said leads into the space between said upper plate and said crimping plate, the movement of said shearing plate being adequate to effect shearing of said leads at said crimping plate.

6. The combination of claim 2 wherein said maintaining means includes means for receiving said wiring board and said upper plate includes said maintaining means.

7. The machine of claim 5 further including means for maintaining said board immovable with respect to said upper plate.

8. The machine of claim 7 wherein said maintaining means includes means for receiving said wiring board and said upper plate includes said maintaining means.

References Cited in the file of this patent

UNITED STATES PATENTS

| | | |
|---|---|---|
| 1,272,068 | McClure et al. | July 9, 1918 |
| 2,380,898 | Pimentel | July 31, 1945 |
| 2,391,061 | MacKintosh | Dec. 18, 1945 |
| 2,713,878 | Stahl | July 26, 1955 |
| 2,737,211 | Perry | Mar. 6, 1956 |